United States Patent
Han et al.

(10) Patent No.: US 7,900,349 B2
(45) Date of Patent: Mar. 8, 2011

(54) METHOD OF FABRICATING AN ELECTRONIC DEVICE

(75) Inventors: Seong-Chan Han, Chungcheongnam-do (KR); Dong-Woo Shin, Chungcheongnam-do (KR); Young-Soo Lee, Seoul (KR); Hyo-Jae Bang, Chungcheongnam-do (KR); Hun Han, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 187 days.

(21) Appl. No.: 11/950,280

(22) Filed: Dec. 4, 2007

(65) Prior Publication Data

US 2008/0130254 A1    Jun. 5, 2008

(30) Foreign Application Priority Data

Dec. 4, 2006    (KR) .................. 10-2006-0121572

(51) Int. Cl.
*H05K 3/34*    (2006.01)
(52) U.S. Cl. ........ 29/840; 29/832; 174/260; 228/180.21; 228/180.22
(58) Field of Classification Search .............. 29/825, 29/830, 832, 840; 174/260; 228/180.21, 228/180.22
See application file for complete search history.

(56) References Cited

U.S. PATENT DOCUMENTS

| 4,562,092 | A | * | 12/1985 | Wiech, Jr. ............... 427/97.5 |
| 5,434,751 | A | * | 7/1995 | Cole et al. ............... 361/792 |
| 5,798,014 | A | * | 8/1998 | Weber .................... 156/263 |
| 6,249,049 | B1 | * | 6/2001 | Kamada et al. ........... 257/703 |
| 6,538,208 | B2 | * | 3/2003 | Yamamoto ............... 174/255 |
| 2001/0001989 | A1 | * | 5/2001 | Smith ..................... 174/52.1 |

FOREIGN PATENT DOCUMENTS

| JP | 10-284673 | 10/1998 |
| JP | 2004-79666 | 3/2004 |
| JP | 2005-116943 | 4/2005 |
| JP | 2005-142178 | 6/2005 |
| KR | 1998-050038 | 10/1998 |
| KR | 2001-0028365 | 4/2001 |

OTHER PUBLICATIONS

English language abstract of Korean Publication No. 1998-050038.
English language abstract of Japanese Publication No. 10-284673.
English language abstact of Korean Publication No. 2001-0028365.
English lanaguage abstract of Japanese Publication No. 2004-79666.
English langauge abstract of Japanese Publication No. 2005-116943.

* cited by examiner

*Primary Examiner* — C. J Arbes
(74) *Attorney, Agent, or Firm* — Volentine & Whitt, PLLC

(57) ABSTRACT

An electronic device with a reworkable electronic component, a method of manufacturing the electronic device, and a method of reworking the electronic component are disclosed. The electronic device includes a first cavity provided in a board body. A first metal pattern is provided on the board body and adjacent to the first cavity. A first electronic component is provided in the first cavity. A first connection pattern is provided adjacent to an upper edge portion of the first electronic component and extends to the first metal pattern so that the first metal pattern is electrically connected to the first electronic component.

17 Claims, 10 Drawing Sheets

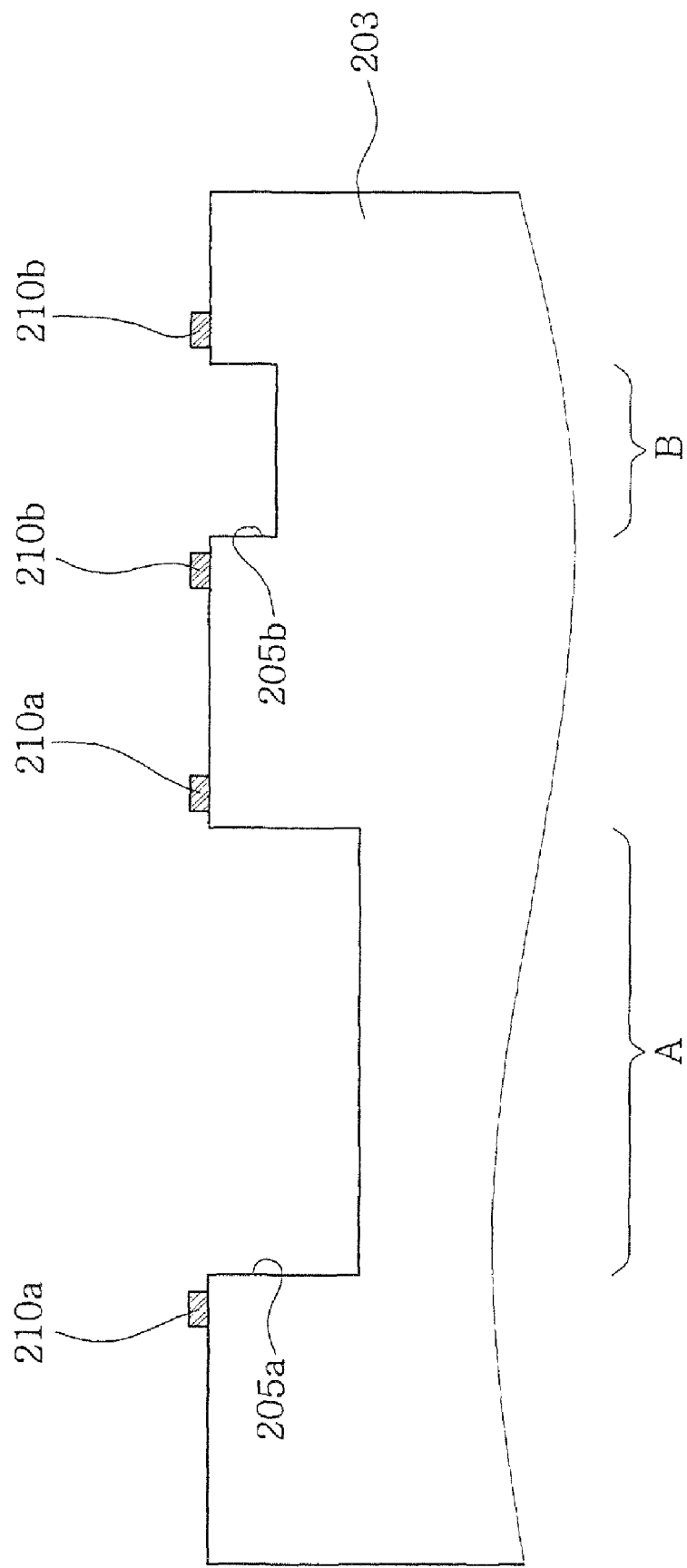

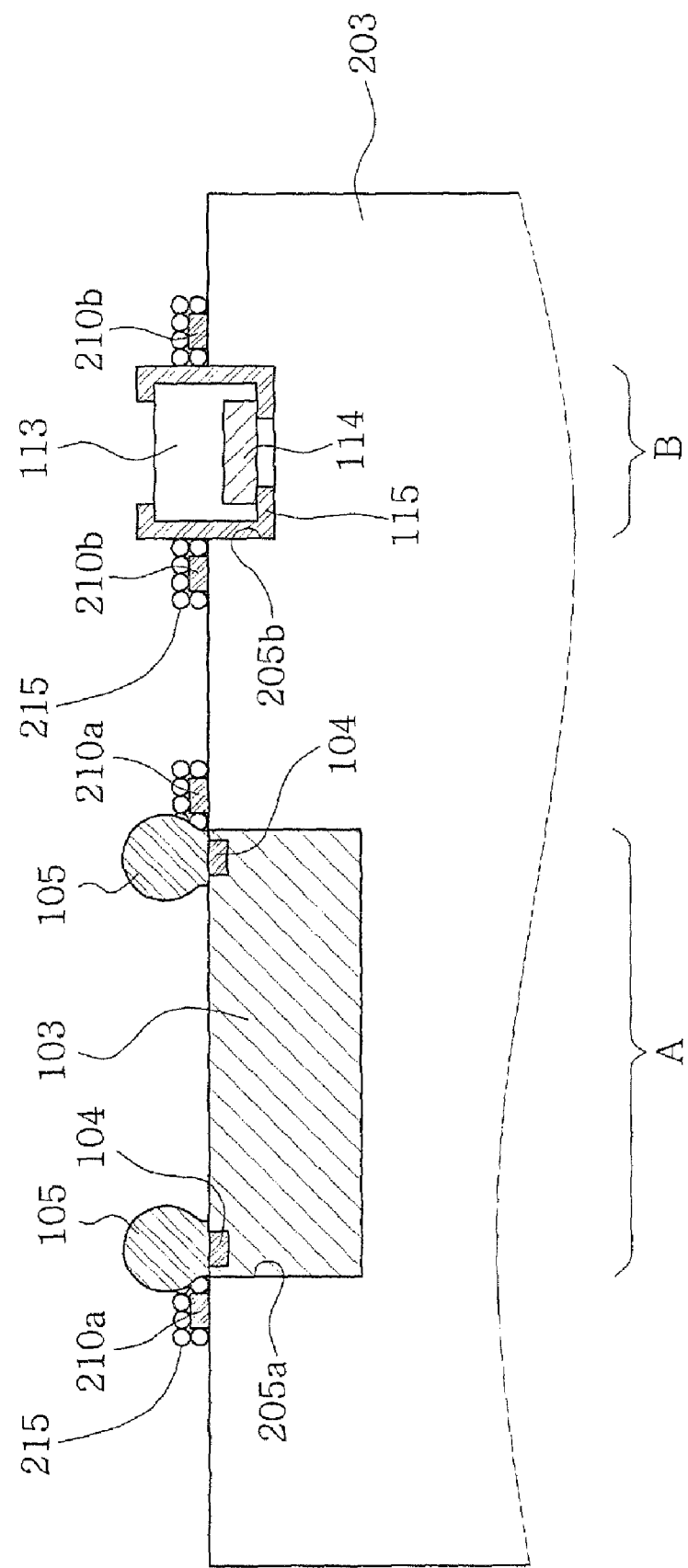

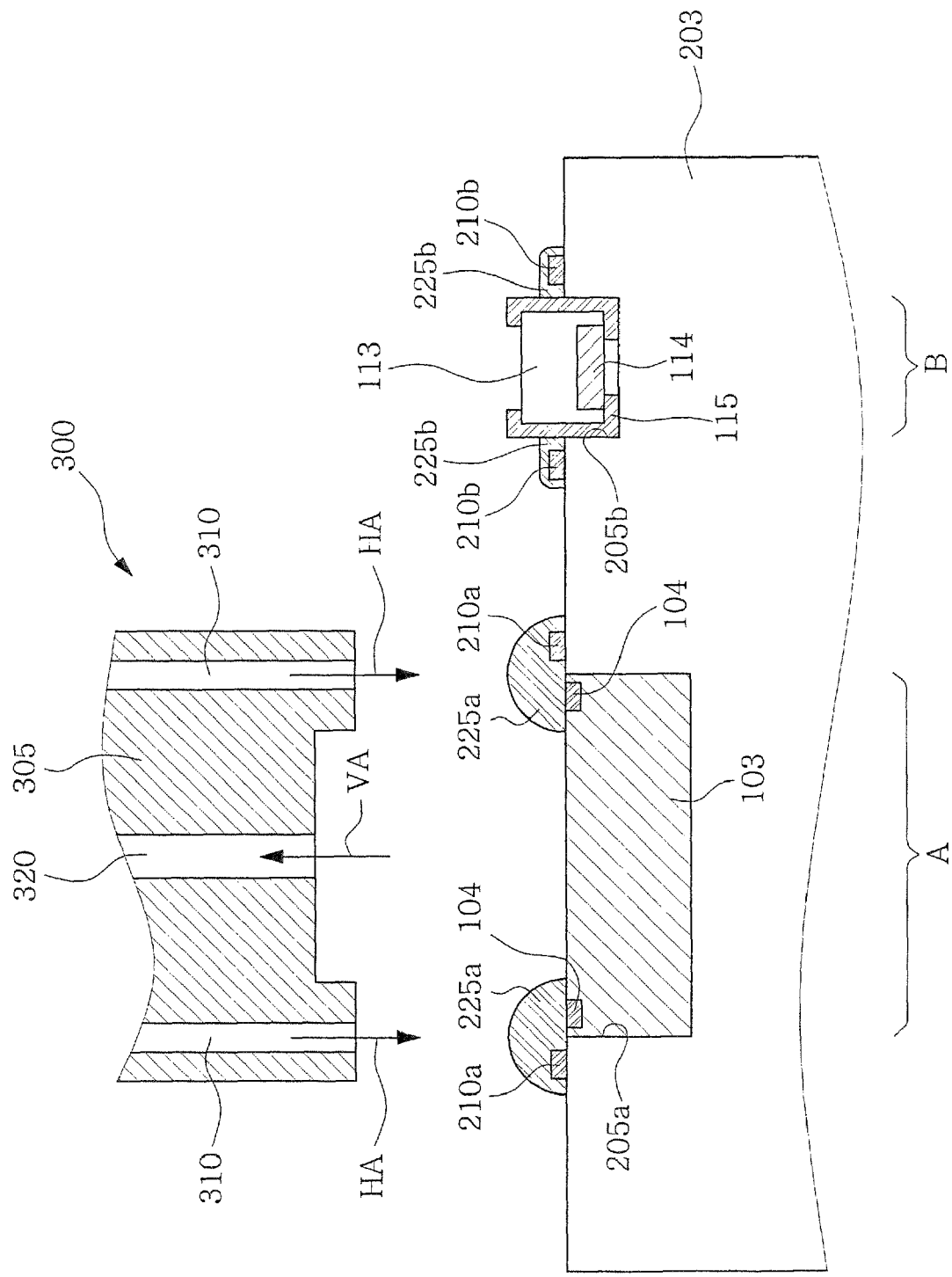

METHOD OF FABRICATING AN ELECTRONIC DEVICE

CROSS-REFERENCE TO RELATED APPLICATION

This application claims the benefit of foreign priority to Korean Patent Application No. 10-2006-0121572, filed Dec. 4, 2006, the disclosure of which is hereby incorporated herein by reference in its entirety as if set forth fully herein.

BACKGROUND

1. Technical Field

Embodiments of the present invention relate generally to electronic devices and methods of manufacturing the same. More particularly, embodiments of the present invention relate to an electronic device with a reworkable electronic component, a method of manufacturing the electronic device, and a method of reworking the electronic component.

2. Discussion of Related Art

In recent years, as electronic products such as mobile phones, personal digital assistants (PDAs), electronic dictionaries, notebook computers, and personal computers get smaller and achieve higher performance levels, high-integration technology for electronic devices constituting an electronic product is being actively studied. High-integration technology includes technology adapted to scale down and lay out components of electronic devices.

In general, electronic product are formed by connecting a semiconductor package of a single chip module to a printed circuit board (PCB) using surface mount technology (SMT) or pin through hole (PTH), thereby forming a printed circuit board card.

FIGS. 1A and 1B are cross-sectional views illustrating a conventional method of mounting an electronic component.

Referring to FIG. 1A, a cavity 12 is formed in a printed board 11. An interconnection pattern 13 is formed on the printed board 11 having the cavity 12. The interconnection pattern 13 includes a surface interconnection pattern 13b formed on a surface of the printed board 11, and a bottom interconnection pattern 13a formed on a bottom of the cavity 12. The surface interconnection pattern 13b and the bottom interconnection pattern 13a are coupled to each other along sidewalls of the cavity 12.

Referring to FIG. 1B, a flip chip 14 including bumps 15 is mounted in the printed board 11. The flip chip 14 is mounted so that the bumps 15 contact the bottom interconnection pattern 13a formed on the bottom surface of the cavity 12. The bumps 15 are melted, hardened, and are securely adhered to the bottom interconnection pattern 13a and the flip chip 14 is fixed to the printed board 11. The electronic device with such components may be thinner than an electronic device formed by a typical surface mounting technique. However, it is difficult to check whether the flip chip 14 is electrically connected to the bottom interconnection pattern 13a. X-ray equipment is needed for checking a contact between the bumps 15 and the bottom interconnection pattern 13a. An insufficient contact between the bumps 15 and the bottom interconnection pattern 13a may degrade reliability of the electronic device. Accordingly, the bumps 15 must be melted and hardened so that they are securely adhered to the bottom interconnection pattern 13a. However, checking the contact between the bumps 15 and the bottom interconnection pattern 13a using the X-ray equipment can be a time consuming and difficult task.

Furthermore, since the contact between the bump 15 and the bottom interconnection pattern 13a is formed near the bottom of the cavity 12, it is difficult to separate the flip chip 14 from the printed board 11. This is because the bumps 15 must be re-melted in order to separate the bumps 15 from the bottom interconnection pattern 13a. Re-melting the bumps 15 requires heating the electronic device. The flip chip 14 and the printed board 11 are deteriorated by high-temperature heat that is applied to the electronic device in order to re-melt the bumps 15 surrounded by the flip chip 14 and the printed board 11.

SUMMARY

Embodiments exemplarily described herein provide an electronic device with a reworkable electronic component.

Embodiments exemplarily described herein also provide a method of fabricating an electronic device with a reworkable electronic component.

Embodiments exemplarily described herein also provide a method of reworking an electronic component.

According to one embodiment, an electronic device with a reworkable electronic component is provided. The device may include a first cavity provided in a board body. A first metal pattern is provided on the board body and adjacent to the first cavity. A first electronic component is provided in the first cavity. A first connection pattern is provided to be located adjacent to an upper edge of the first electronic component and to extend to the first metal patterns so that the first metal pattern is electrically connected to the first electronic component. A material of the first connection pattern may have a lower melting point than a material of the first metal pattern.

According to another embodiment, a method of manufacturing an electronic device with a reworkable electronic component is provided. In the method, a board body may be provided. A first cavity may be formed in the first region of the board body. First metal patterns are formed on the board body and adjacent to the first region. A first electronic component is inserted into the first cavity. The first electronic component includes a first body and a conductive ball located at an edge portion of an upper surface of the first body. The conductive ball is melted and hardened to form a first connection pattern located adjacent to the edge portion of the upper surface of the first body and extending to the first metal pattern so that the first metal pattern is electrically connected to the first electronic component. A material of the conductive ball may have a lower melting point than a material of the first metal pattern.

According to yet another embodiment, a method of reworking an electronic component is provided. The method may include preparing an electronic device. The electronic device may include a board body, a cavity provided in the board body, a metal pattern provided on the board body and adjacent to the cavity, an electronic component provided in the cavity and a connection pattern covering the metal patterns and contacting the electronic component. Repair equipment is provided. The repair equipment includes an exhaust channel for exhausting a high-temperature gas and a suction channel for providing a suction force. Heat from a high-temperature gas exhausted from the repair equipment is applied to the connection pattern. The electronic component is separated from the board body using the suction force provided by the repair equipment.

BRIEF DESCRIPTION OF THE DRAWINGS

The above and other features and advantages of the present invention will become more apparent to those of ordinary skill in the art by describing in detail preferred embodiments thereof with reference to the attached drawings in which:

FIGS. 4A to 4D are cross-sectional views illustrating a method of manufacturing an electronic device according to one embodiment of the present invention; and FIG. 5 is a cross-sectional view illustrating a method of reworking an electronic component of an electronic device according to one embodiment of the present invention.

DETAILED DESCRIPTION

Figure 1A:
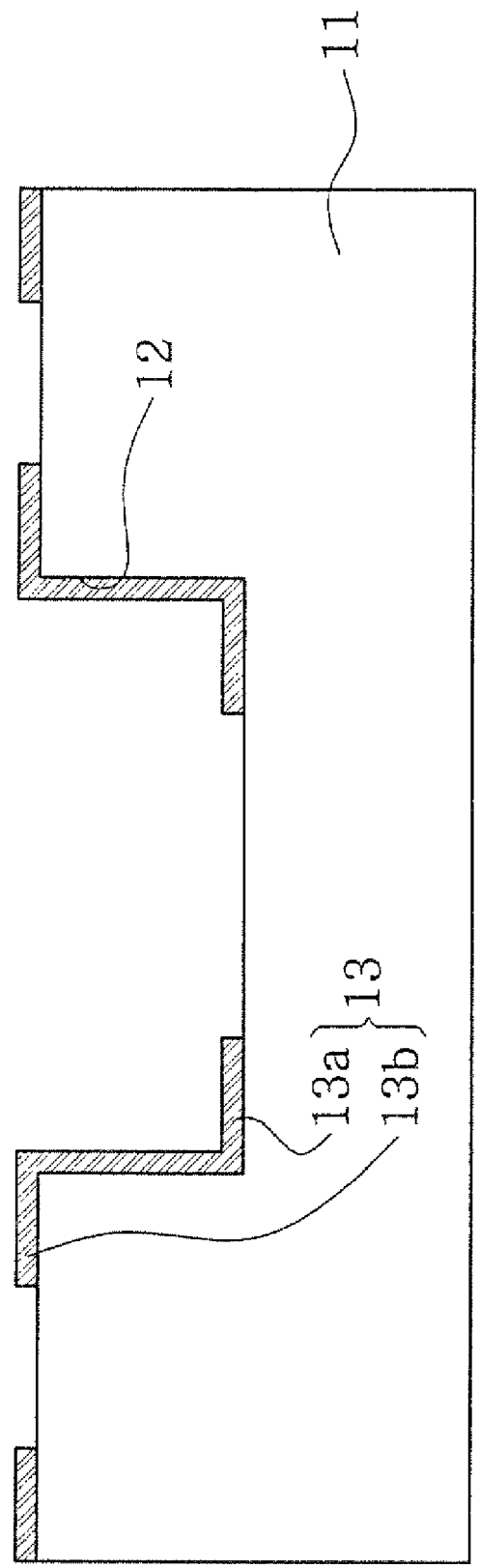
FIGS. 1A and 1B are cross-sectional views illustrating a conventional method of mounting an electronic component.
Figure 1B:
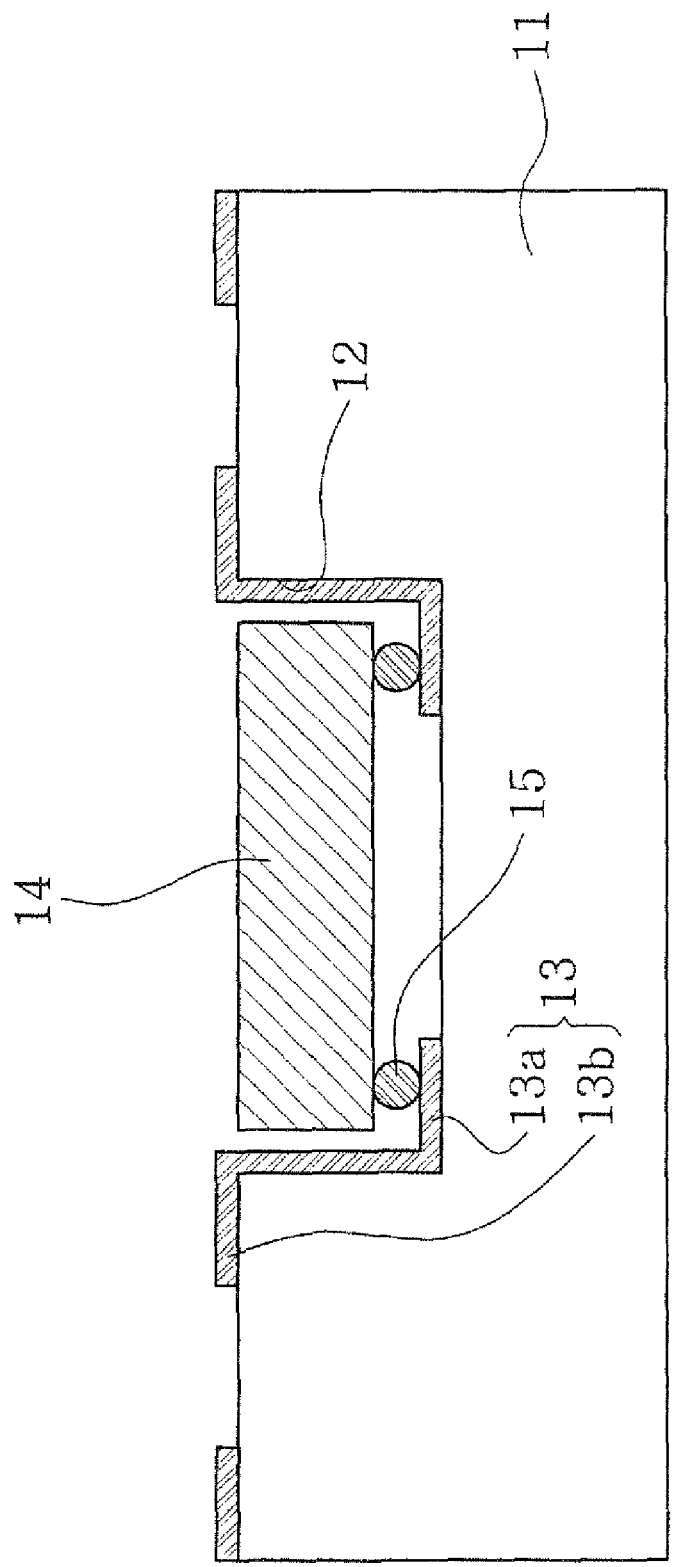

Embodiments of the present invention will now be described more fully hereinafter with reference to the accompanying drawings. These embodiments may, however, be realized in many different forms and should not be construed as being limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. Like numbers refer to like elements throughout the specification.

Figure 2:
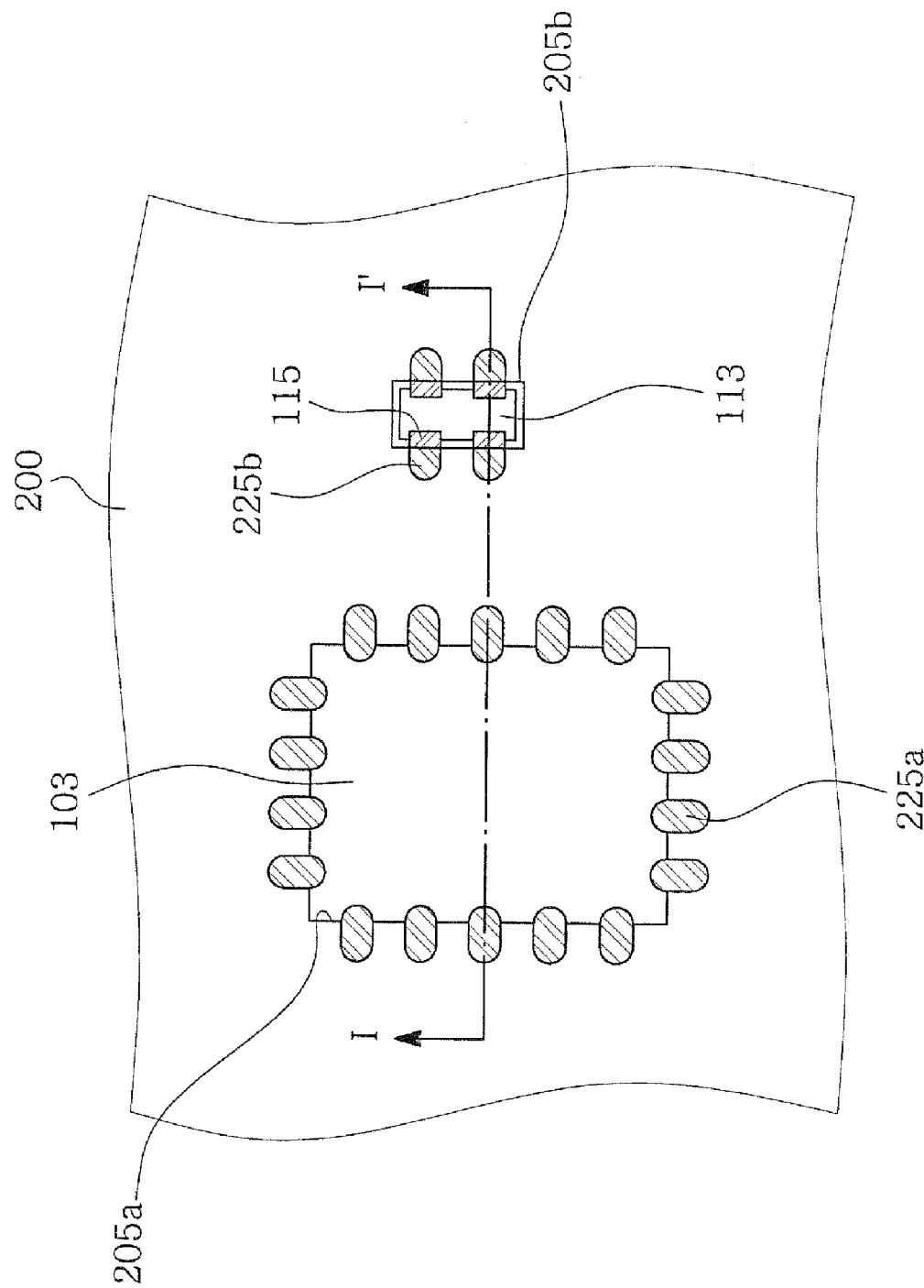
FIG. 2 is a plan view illustrating an electronic device according to one embodiment of the present invention.
Figure 3B:
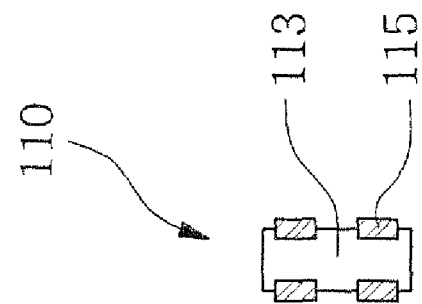
FIGS. 3A to 3C are plan views illustrating electronic components of an electronic device according to one embodiment of the present invention.
Figure 3A:
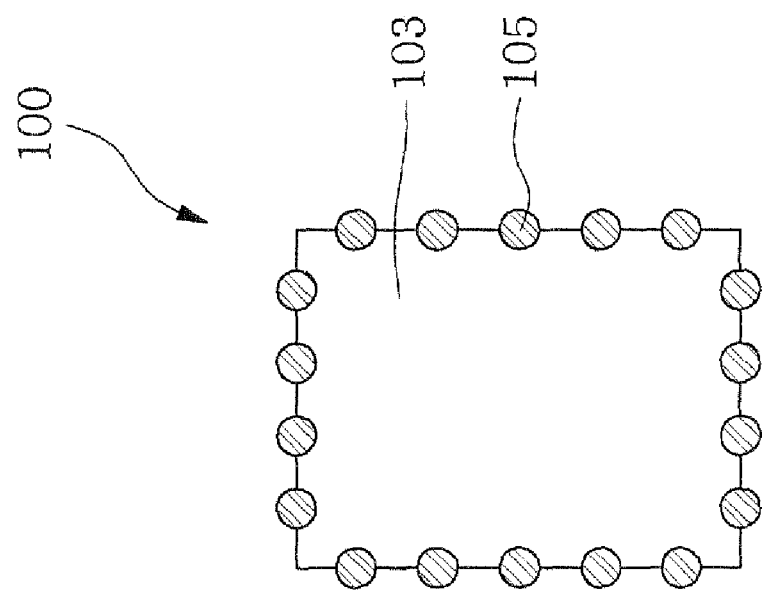
Figure 3C:
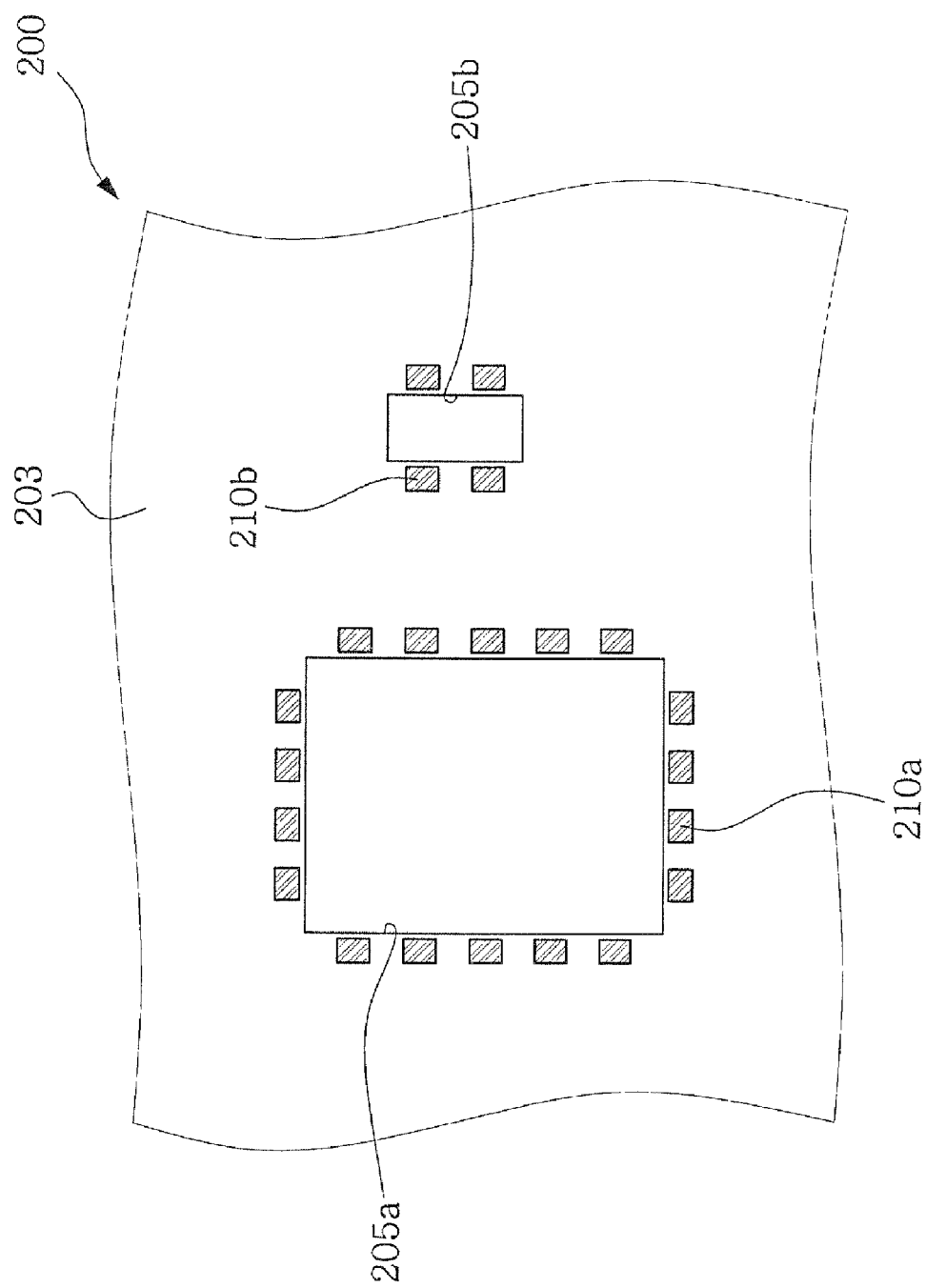

FIG. 2 is a plan view illustrating an electronic device according to one embodiment of the present invention. FIGS. 3A to 3C are plan views illustrating electronic components of an electronic device according to one embodiment. FIGS. 4A to 4D are cross-sectional views taken along line I-I' of FIG. 2. FIG. 5 is a cross-sectional view illustrating a method of reworking an electronic component of an electronic device according to one embodiment.

Electronic components used for manufacturing an electronic device according to embodiments of the present invention will be briefly described with reference to FIGS. 3A to 3C prior to exemplarily describing the structure of the electronic device and the method of manufacturing the electronic device.

Referring to FIG. 3A, a first electronic component 100 may include a first body 103. The first electronic component 100 may further include conductive balls 105 provided on the first body 103. The conductive balls 105 may, for example, include solder balls or lead-free solder balls. The conductive balls 105 may be located at edge portions of an upper surface of the first body 103. When viewed in plan view, the conductive balls 105 may overlap the first body 103 and protrude outwardly from the first body 103. The conductive balls 105 may include a plurality of conductive balls. For example, a plurality of conductive balls 105 may be formed at intervals at the edge portions of the upper surface of the first body 103.

The first electronic component 100 may, for example, include a semiconductor chip module. For example, the first electronic component 100 may include a memory chip, such as a volatile memory chip and a nonvolatile memory chip, a non-memory chip, or the like or a combination thereof.

Referring to FIG. 3B, a second electronic component 110 may include a second body 113, and at least one connection terminal 115 disposed on sidewalls of the second body 113.

The second electronic component 110 may, for example, include a passive element module or an active element module. For example, the second electronic component 110 may include a passive element such as a resistor, a capacitor and an inductor, an active element such as an oscillator, or the like or a combination thereof.

Referring to FIG. 3C, a printed circuit board 200 may, for example, include a board body 203, a first cavity 205a formed in the board body 203, and at least one first metal pattern 210a adjacent to the first cavity 205a. The printed circuit board 200 may further include a second cavity 205b provided in the board body 203 and spaced apart from the first cavity 205a, and at least one second metal pattern 210b adjacent to the second cavity 205b.

A structure of an electronic device and a method of manufacturing the electronic device according to some embodiments of the present invention will now be described.

The structure of an electronic device according to an embodiment of the present invention will first be described with reference to FIGS. 2 and 4D.

Figure 4B:
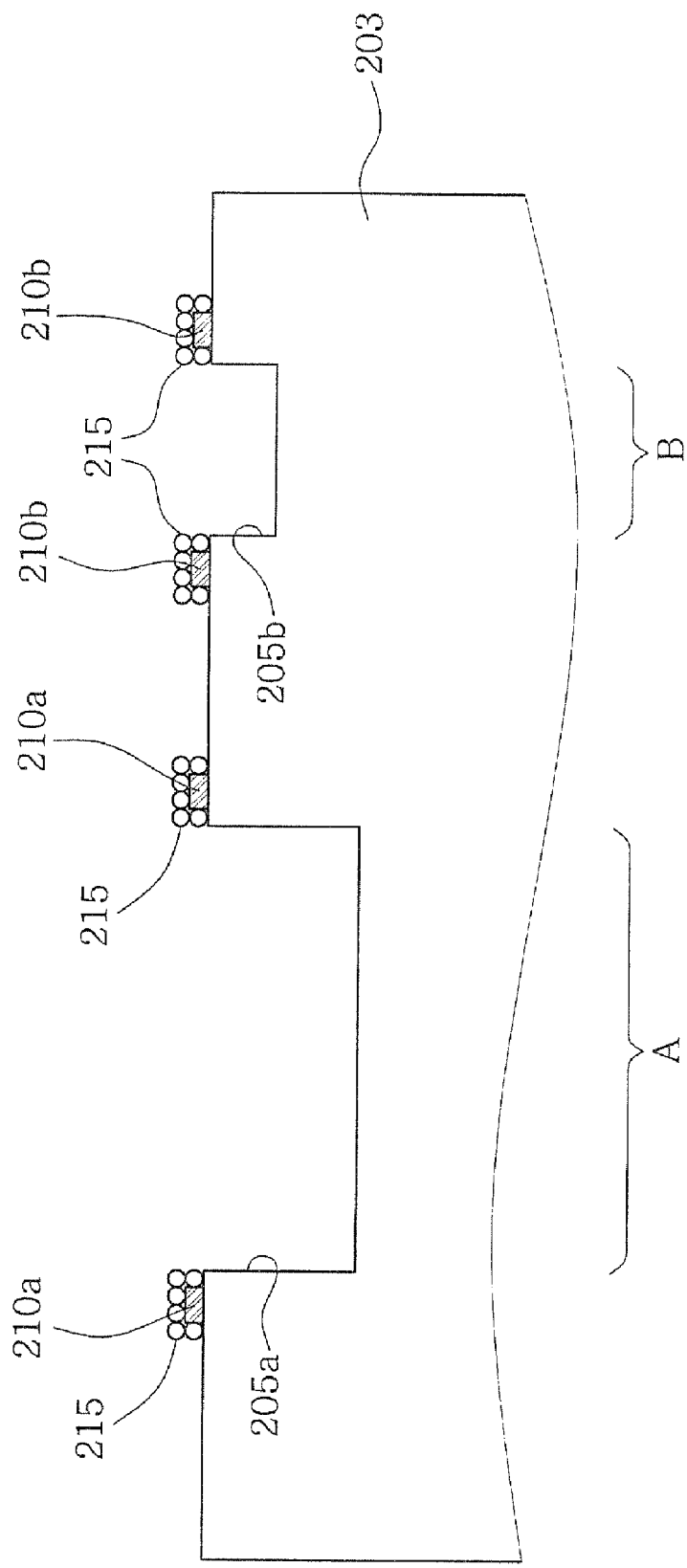
Figure 4D:
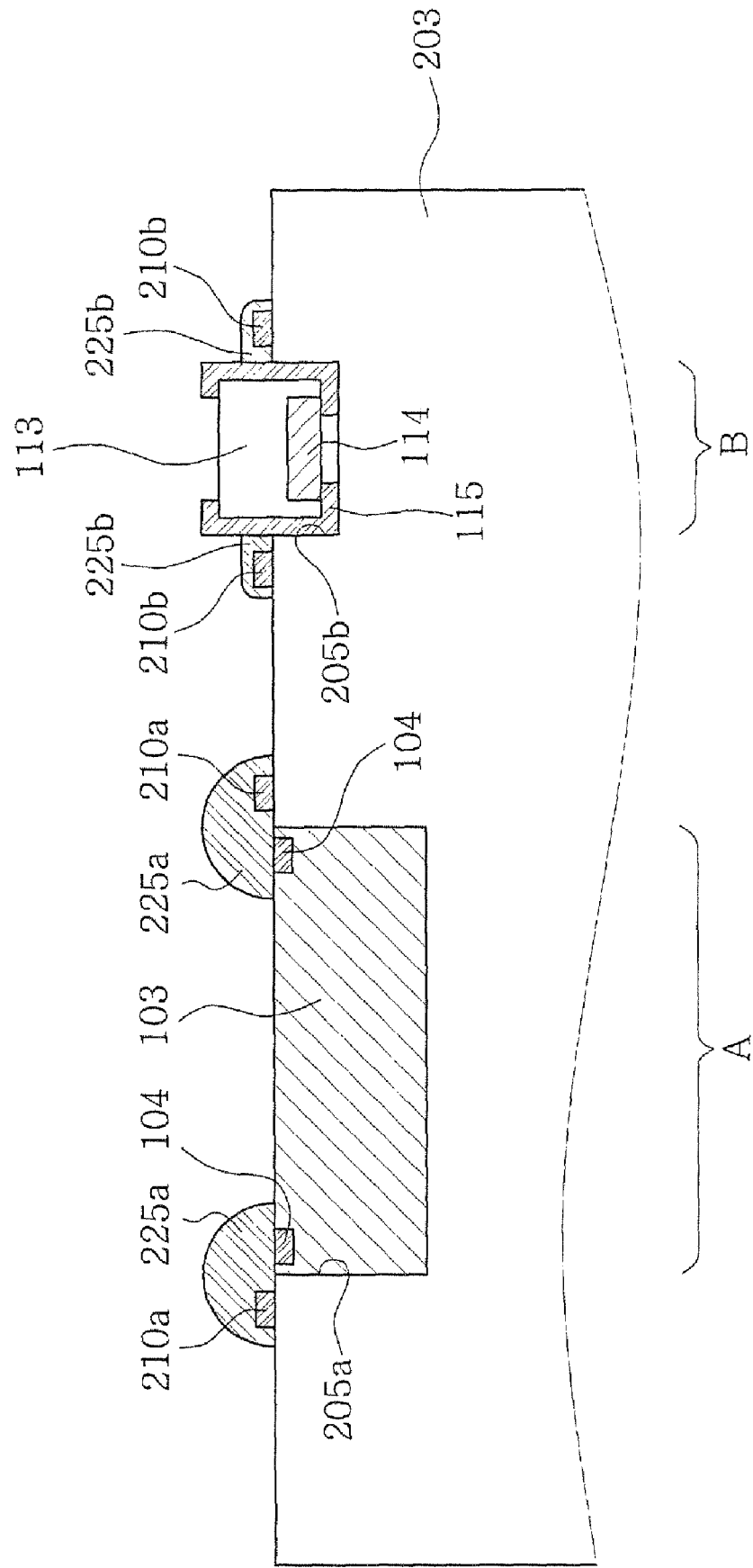

Referring to FIGS. 2 and 4D, a board body 203 having a first region "A" and a second region "B" may be provided. The board body 203 may, for example, include a printed circuit board. First and second cavities 205a and 205b may be provided in the first and second regions "A" and "B" of the board body 203, respectively. The first and second cavities 205a and 205b may have respective bottom surfaces at different levels within the board body 203. For example, the bottom surface of the second cavity 205b may be located at a higher level than the bottom surface of the first cavity 205a.

At least one first metal pattern 210a may be provided which is located on the board body 203 and adjacent to the first cavity 205a. At least one second metal pattern 210b may be provided which is located on the board body 203 and adjacent to the second cavity 205b. The first and second metal patterns 210a and 210b may include a copper layer.

A first electronic component 100 may be provided in the first cavity 205a. For example, the first electronic component 100 as described with reference to FIG. 3A may be provided in the first cavity 205a. The first body 103 may be inserted into the first cavity 205a. Ball pads 104 may be provided in an upper region of the first body 103. Each of the ball pads 104 may be an input/output terminal for electrical signals or power.

A second electronic component 110 may be provided in the second cavity 205b. For example, the second electronic component 110 as described with reference to FIG. 3B may be provided in the second cavity 205b. Specifically, the second body 113 may be provided in the second cavity 205b and the connection terminals 115 may be provided between the second body 113 and the second cavity 205b. An element 114 such as a passive element or an active element may be provided in the second body 113. The connection terminals 115 may be electrically connected to the individual element 114. Accordingly, the second electronic component 110 may be a passive element module or an active element module. Alternatively, the second electronic component 110 may be a semiconductor chip module.

Since the first and second cavities 205a and 205b have bottom surfaces at different levels within the board body 203, electronic components having different thicknesses may be inserted into the board body 203. In this manner, a variety of electronic components may be mounted together, but the electronic device may have a reduced thickness.

First connection patterns 225a may be provided to electrically connect the first metal patterns 210a to the first electronic component 100. Second connection patterns 225b may be provided to electrically connect the second metal patterns 210b to the second electronic component 110.

The first connection patterns 225a may be located at an upper edge portion of the first electronic component 100 and extend to the first metal pattern 210a. In this case, the first connection patterns 225a may cover the first metal patterns 210a. For example, the first connection patterns 225a may cover the ball pads 104 located at the edge portions of the upper portion of the first body 103 of the first electronic component 100 and extend to the first metal patterns 210a so that the first metal patterns 210a are covered. The first connection patterns 225a may be dome-shaped. The first connection patterns 225a may include substantially the same material of the conductive balls 105 shown in FIG. 3A. For example, the first connection patterns 225a may include solder or lead-free solder. Accordingly, a material of the first connection patterns 225a may have a lower melting point than a material of the first metal patterns 210a.

The second connection patterns 225b may cover the second metal patterns 210b and contact sidewalls of the second electronic component 110. For example, the second connection patterns 225b may cover the second metal patterns 210b and contact the connection terminals 115 located on the sidewalls of the second electronic component 110. The second connection patterns 225b may, for example, include solder or lead-free solder. Accordingly, a material of the second connection patterns 225b may have a lower melting point than a material of the second metal patterns 210b.

The first and second connection patterns 225a and 225b are located on the upper surface of the board body 203. This allows to check whether contact between the first connection patterns 225a and the first metal patterns 210a, and the contact between the second connection patterns 225b and the second metal patterns 210b, is normal or not. Such checking may be accomplished using an operator's eyes or an optical microscope. High-temperature heat may be selectively applied to the first and second connection patterns 225a and 225b.

Although the board body 203 has been described above as having the first and second regions "A" and "B", it will be appreciated that the present invention is not limited thereto. For example, an electronic device having the first electronic component 100 mounted in a board body having only the first region "A", or an electronic device having the second electronic component 110 mounted in a board body having only the second region "B" may be provided.

A method of manufacturing the electronic device according to an embodiment of the present invention will now be described with reference to FIGS. 2, 3A to 3C, and 4A to 4D.

A method of forming the printed circuit board 200 as described with reference to FIG. 3C will be described with referenced to FIG. 4A.

Referring to FIG. 4A, a board body 203 having a first region "A" and a second region "B" is prepared. The first region "A" and the second region "B" may be spaced apart from each other. A first cavity 205a may be formed in the first region "A" of the board body 203 and a second cavity 205b may be formed in the second region "B" of the board body 203. The first and second cavities 205a and 205b may have respective bottom surfaces at different levels within the board body 203. For example, the bottom surface of the second cavity 205b may be located at a higher level than the bottom surface of the first cavity 205a within the board body 203. The first and second cavities 204a and 205b may be formed, for example, using a laser or by performing a photolithographic process. At least one first metal pattern 210a may be then formed on the board body 203 adjacent to the first cavity 205a, and at least one second metal pattern 210b may be formed adjacent to the second cavity 205b. The first and second metal patterns 210a and 210b may, for example, include a copper layer.

In another embodiment, the first and second cavities 205a and 205b may be formed after the first and second metal patterns 210a and 210b are formed. For example, the first and second metal patterns 210a and 210b respectively adjacent to the first and second regions "A" and "B" may be formed on the board body 203 and the first and second cavities 205a and 205b may then be formed in the first and second regions "A" and "B" of the board body 203, respectively.

A plurality of first metal patterns 210a may be formed to surround the first cavity 205a, as shown in FIG. 3C. Similarly, a plurality of second metal patterns 210b may be formed to surround the second cavity 205b, as shown in FIG. 3C.

A method of manufacturing an electronic device according to one embodiment of the present invention will now be described with reference to FIGS. 2, 3A to 3C, and 4B to 4D.

Referring to FIGS. 2, 3A to 3C, and 4B, a conductive paste 215 may be formed on the first and second metal patterns 210a and 210b of the printed circuit board 200 illustrated in FIG. 4A. The conductive paste 215 may, for example, include solder paste or lead-free solder paste. In one embodiment, the conductive paste 215 may, for example, include a metal (e.g., solder or lead-free solder) and flux. The flux may include a liquid flux. The flux may be vaporized when the conductive paste 215 is melted in a subsequent process since a vaporization point of the flux is lower than a melting point of the solder.

Referring to FIGS. 2, 3A to 3C, and 4C, the first electronic component 100 described with reference to FIG. 3A may be inserted into the first cavity 205a of the board body 203. The second electronic component 110 described with reference to FIG. 3B may be inserted into the second cavity 205b of the board body 203.

The first electronic component 100 may include the first body 103, ball pads 104 located on an upper portion of the first body 103, and conductive balls 105 located at upper edge portions of the first body 103. The conductive balls 105 may be adhered to the first metal patterns 210a by the conductive paste 215. The conductive balls 105 may, for example, include solder or lead-free solder.

The second electronic component 110 may include a second body 113 and connection terminals 115 provided on sidewalls of the second body 113. The second electronic component 110 may further include an individual element 114 provided in the second body 113 and electrically connected to the connection terminals 115. The individual element 114 may be a passive element or an active element. The connection terminals 115 may be adhered to the second metal patterns 210b by the conductive paste 215.

Referring to FIGS. 2, 3A to 3C, and 4D, first connection patterns 225a contacting the first metal patterns 210a and second connection patterns 225b contacting both the second metal patterns 210b and the connection terminal 115 may be formed by heating the board body 203 having the first and second electronic components 100 and 110 inserted into the first and second cavities 205a and 205b. Upon heating the board body 203, the conductive paste 215 shown in FIG. 4C is melted and hardened. When the conductive paste 215 shown in FIG. 4C is melted and hardened, the conductive balls 105 shown in FIG. 4C may be also melted and hardened.

In one embodiment, the conductive paste 215 shown in FIG. 4C and the conductive balls 105 shown in FIG. 4C may be selectively heated. They may be selectively heated with heat applied to the first body 103, the second body 113 and the board body 203 minimized. For example, a high-temperature gas may be selectively applied to the conductive paste conductive paste 215 shown in FIG. 4C and the conductive balls 105 shown in FIG. 4C to melt them.

In this manner, the first connection patterns 225a may be formed by melting and hardening the conductive paste 215 shown in FIG. 4C and the conductive balls 105 shown in FIG. 4C, and the second connection pattern 225b may be formed by melting and hardening the conductive paste 215 shown in FIG. 4C. The first connection patterns 225a may cover the first metal patterns 210a and extend onto the first electronic component 100 so that the upper edge portions of the first body 103 are covered. In this case, the first connection patterns 225a may cover the ball pad 104. The first connection patterns 225a may be dome-shaped.

The first connection patterns 225a may serve to fix the first body 103 to the board body 203. Similarly, the second connection patterns 225b may serve to fix the second body 113 to the board body 203.

In the electronic device exemplarily described above, it may be necessary to selectively separate the first electronic component 100. For example, it may be necessary to separate the first electronic component 100 from the printed circuit board because of a defective printed circuit board or selectively separate a defective one of a plurality of electronic components from the printed circuit board. A method of selectively separating the electronic component from the electronic device will be described.

Referring to FIG. 5, repair apparatus 300 may be located on the electronic device as shown in FIG. 4D. The repair apparatus 300 may, for example, include a repair equipment body 305, a suction channel 320 provided in the repair equipment body 305, and exhaust channels 310 disposed around the suction channel 320. The repair apparatus 300 may be located over the first region "A", the suction channel 320 of the repair apparatus 300 may be located over the first cavity 205a and the exhaust channels 310 of the repair apparatus 300 may be located over the first connection patterns 225a. High-temperature air HA may be exhausted toward the first connection patterns 225a through the exhaust channels 310 so as to apply heat to the first connection patterns 225a. The first connection patterns 225a may be softened by the high-temperature gas from the repair apparatus 300. The high-temperature gas may, for example, include nitrogen gas. In one embodiment, the high-temperature gas may be nitrogen gas.

A suction force VA may be generated through the suction channel 320 before the softened first connection patterns 225a are hardened. The first body 103 of the first electronic component 100 may be separated from the first cavity 205a by the suction force VA and adhered to a bottom surface of the repair apparatus 300.

Alternatively, the first connection patterns 225a may be softened, and then removed by sucking the first connection patterns 225a or may be removed by strongly blowing air to the first connection patterns 225a. The first body 103 may be then separated from the first cavity 205a by the suction force VA. In this case, the first body 103 of the first electronic component 100 and the board body 203 can be prevented from being deteriorated by the heat because high-temperature heat is selectively applied to the first connection patterns 225a using the high-temperature gas HA.

The second electronic component 110 may be separated from the board body 203 using the same method as that of separating the first electronic component 100 from the board body 203.

As described above, electronic components may be inserted into the printed circuit board in a manner that reduces a thickness of a resultant electronic device. An electronic device may include outwardly exposed connection patterns which may electrically connect, and fix, the electronic component to the printed circuit board. The outwardly exposed connection patterns facilitate checking the connection patterns for defection. Furthermore, high-temperature heat can be selectively applied to the connection patterns, thereby preventing the printed circuit board and the electronic component from being deteriorated by the high-temperature heat while the electronic component is being separated from the printed circuit board.

The following paragraphs characterize some, but not all, of the embodiments described herein in a general sense.

According to some embodiments, an electronic device may be characterized as including a board body; a first cavity provided in the board body; a first metal pattern provided on the board body and adjacent to the first cavity; a first electronic component provided in the first cavity; and a first connection pattern located adjacent to an upper edge of the first electronic component and extending to the first metal pattern. The first metal pattern may be electrically connected to the first electronic component and wherein a material of the first connection pattern has a lower melting point than a material of the first metal pattern.

In one embodiment, the board body may be a body of a printed circuit board.

In one embodiment, the first electronic component may include a first body and a ball pad provided adjacent to an edge of an upper portion of the first body.

In one embodiment, the first electronic component may include a semiconductor chip module.

In one embodiment, the first connection pattern may cover at least a portion of the first metal pattern.

In one embodiment, the electronic device may further include a second cavity provided in the board body and spaced apart from the first cavity; a second metal pattern provided on the board body and adjacent to the second cavity; a second electronic component provided in the second cavity; and a second connection pattern covering at least a portion of the second metal pattern and contacting a sidewall of the second electronic component. The second connection pattern may be electrically connected to the second metal pattern. In such an embodiment, bottom surfaces of the first and second cavities may be at different levels within the board body. Further, the bottom surface of the second cavity may be at a higher level within the board body than the bottom surface of the first cavity. Also, the second electronic component may include a second body and a connection terminal provided on a sidewall of the second body. Furthermore, the second electronic component may include a semiconductor chip module, a passive element module, an active element module or a combination thereof.

According to some embodiments, a method of manufacturing an electronic device may include providing a board body; forming a first cavity in the board body; forming a first metal pattern on the board body and adjacent to the first cavity; inserting a first electronic component into the first cavity; and forming a first connection pattern located adjacent to an upper edge of the first electronic component and extending to the first metal pattern, wherein the first metal pattern is electrically connected to the first electronic component and wherein a material of the first connection pattern has a lower melting point than a material of the first metal pattern.

In one embodiment, the first electronic component may include a first body and a conductive ball located at an edge portion of an upper surface of the first body and the method may include melting and hardening the conductive ball to form the first connection pattern.

In one embodiment, the method may further include forming the first connection pattern to cover the first metal pattern.

In one embodiment, the method may further include forming a second cavity in the board body, wherein the second cavity is spaced apart from the first cavity; forming a second metal pattern on the board body and adjacent to the second cavity; inserting a second electronic component into the second cavity; and forming a second connection pattern covering at least a portion of the second metal pattern and contacting a sidewall of the second electronic component, wherein the second connection pattern is electrically connected to the second electronic component. In such an embodiment, the method may further include forming the second cavity in the second region while forming the first cavity. In another embodiment, the method may further include forming the second metal pattern on the board body while forming the first metal pattern. In yet another embodiment, the method may further include inserting the second electronic component into the second cavity while inserting the first electronic component into the first cavity. In still another embodiment, the method may further include forming the second connection pattern while forming the first connection pattern.

In one embodiment, the method may further include forming a conductive paste on the first and second metal patterns.

According to some embodiments, a method of reworking an electronic component may include preparing an electronic device comprising a board body, a cavity provided in the board body, a metal pattern provided on the board body and adjacent to the cavity, an electronic component provided in the cavity and a connection pattern covering at least a portion of the metal pattern and contacting the electronic component; providing a repair apparatus having an exhaust channel for exhausting a high-temperature gas and a suction channel for providing a suction force; applying heat from the exhaust channel of the repair apparatus to the connection pattern; and separating the electronic component from the board body using the suction force provided by the repair apparatus.

In one embodiment, the connection pattern may contact the electronic component and may contact at least one of an upper edge portion or sidewall of the electronic component.

In one embodiment, the high-temperature gas may include nitrogen.

While embodiments of the present invention have been exemplarily shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an electronic device, the method comprising:
   providing a board body;
   forming a first cavity in a first surface of the board body;
   forming a first metal pattern on the first surface of the board body adjacent to the first cavity;
   inserting a first electronic component into the first cavity, wherein the electronic component includes a conductive ball on an upper surface, wherein a melting point of the conductive ball is less than a melting point of the first metal pattern, and wherein the first electronic component is inserted into the first cavity such that the conductive ball is adjacent the first metal pattern on the first surface of the board body;
   melting the conductive ball of the first electronic component to cause the conductive ball to flow into contact the first metal pattern on the first surface of the board body; and
   hardening the melted conductive ball to define a first connection pattern which electrically connects the first electronic component to the first metal pattern.

2. The method of claim 1, wherein the first electronic component comprises a semiconductor chip module.

3. The method of claim 1, wherein the conductive ball is melted to completely cover the first metal pattern.

4. The method of claim 1, further comprising:
   forming a second cavity in the first surface of the board body, wherein the second cavity is spaced apart from the first cavity;
   forming a second metal pattern the first surface of on the board body adjacent to the second cavity;
   inserting a second electronic component into the second cavity, wherein the second electronic component includes a contact pattern on a sidewall thereof; and
   forming a second connection pattern covering at least a portion of the second metal pattern and contacting the contact pattern on the sidewall of the second electronic component, wherein the second metal pattern is electrically connected to the second electronic component by the second connection pattern.

5. The method of claim 4, wherein the second cavity is formed at the same time as the first cavity.

6. The method of claim 4, wherein the second metal pattern is formed at the same time as the first metal pattern.

7. The method of claim 4, wherein the second electronic component is inserted into the second cavity the same time the first electronic component is inserted into the first cavity.

8. The method of claim 4, wherein the second connection pattern is formed the same time as the first connection pattern.

9. The method of claim 4, further comprising forming the second cavity to have a bottom surface at a different level within the board body from a bottom surface of the first cavity.

10. The method of claim 9, further comprising forming the second cavity to have a bottom surface at a higher level than a bottom surface of the first cavity.

11. The method of claim 4, wherein the second electronic component comprises a semiconductor chip module, a passive element module, an active element module, or a combination thereof.

12. The method of claim 4, further comprising forming a conductive paste on the first and second metal patterns.

13. The method of claim 1, further comprising forming a conductive paste on the first metal pattern before melting the conductive ball.

14. The method of claim 13, wherein the first connection pattern is formed by melting and hardening the conductive paste and the conductive ball.

15. The method of claim 1, wherein the first connection pattern is formed of solder or lead-free solder.

16. The method of claim 1, wherein the first connection pattern is domeshaped.

17. A method of manufacturing an electronic device, the method comprising:
   providing a printed circuit board;
   forming a first cavity in the printed circuit board;
   forming a first metal pattern on the printed circuit board and adjacent to the first cavity;

preparing a first electronic component, wherein the first electronic component comprises a first body and a conductive ball located at an edge portion of an upper surface of the first body;
inserting the first electronic component into the first cavity; and
forming a first connection pattern on the first electronic component and the printed circuit board, wherein the first connection pattern is located adjacent to an upper edge of the first electronic component and extends to the first metal pattern,
wherein the first connection pattern is formed by melting and hardening the conductive ball.

* * * * *